(12) United States Patent
Misra et al.

(10) Patent No.: US 7,253,466 B2
(45) Date of Patent: Aug. 7, 2007

(54) CROSSBAR ARRAY MICROELECTRONIC ELECTROCHEMICAL CELLS

(75) Inventors: Veena Misra, Raleigh, NC (US); John Damiano, Jr., Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 43 days.

(21) Appl. No.: 11/166,938

(22) Filed: Jun. 24, 2005

(65) Prior Publication Data

US 2005/0242389 A1 Nov. 3, 2005

Related U.S. Application Data

(62) Division of application No. 10/407,680, filed on Apr. 4, 2003, now Pat. No. 6,958,270.

(60) Provisional application No. 60/433,923, filed on Dec. 17, 2002.

(51) Int. Cl.
*H01L 29/76* (2006.01)

(52) U.S. Cl. .................. 257/314; 257/295; 257/296; 257/315; 257/E27.004; 438/257; 438/593; 365/65; 365/117

(58) Field of Classification Search ........ 257/314–316; 438/257, 593; 365/65, 117
See application file for complete search history.

(56) References Cited

U.S. PATENT DOCUMENTS

| | | | |
|---|---|---|---|
| 6,128,214 A | 10/2000 | Kuekes et al. | |
| 6,208,553 B1 | 3/2001 | Gryko et al. | |
| 6,212,093 B1 | 4/2001 | Lindsey | |
| 6,272,038 B1 | 8/2001 | Clausen et al. | |
| 6,351,406 B1 | 2/2002 | Johnson et al. | |
| 6,451,942 B1 | 9/2002 | Li et al. | |
| 6,483,726 B2 | 11/2002 | Chen et al. | |
| 6,567,301 B2 | 5/2003 | Anthony et al. | |
| 7,074,519 B2 * | 7/2006 | Kuhr et al. | 429/149 |
| 2003/0082444 A1 | 5/2003 | Kuhr et al. | |

FOREIGN PATENT DOCUMENTS

WO  WO 02/22711  3/2002

OTHER PUBLICATIONS

Harell, S. et al.; *Microelectron Eng.* 30:11 (1996).
Reed, M. A. et al.; *Science* 278 252-254 (1997).
Reed, M. A.; *Proc. IEEE* 87 652-658 (1999).
Roth, K. M. et al.; *J. Vac. Sci. Technol. B*. 18:5 2359 (2000).

* cited by examiner

*Primary Examiner*—Dung A. Le
(74) *Attorney, Agent, or Firm*—Myers Bigel Sibley & Sajovec

(57) ABSTRACT

The present invention provides microelectronic electrochemical structures and related fabrication methods. A composite microelectronic structure is provided that includes first and second conductors dielectrically isolated from one another at a crossing thereof, the crossing surrounded by a dielectric material. A portion of the dielectric material around the crossing of the first and second conductors is removed to form a well that exposes respective outer surfaces of the first and second conductors and a molecule is deposited in the well such that the deposited molecule contacts the exposed outer surfaces of the first and second conductors.

32 Claims, 5 Drawing Sheets

CROSSBAR ARRAY MICROELECTRONIC ELECTROCHEMICAL CELLS

RELATED APPLICATIONS

This application is a divisional application of U.S. patent application Ser. No. 10/407,680, filed Apr. 4, 2003, now U.S. Pat. No. 6,958,270, which claims priority Provisional Application Ser. No. 60/433,923, filed Dec. 17, 2002, entitled Crossbar Array Microelectronic Electrochemical Cells and Fabrication Methods Therefor, the disclosures of which are hereby incorporated herein by reference as if set forth in its entirety.

FIELD OF THE INVENTION

The present invention relates to microelectronic devices and, more particularly, to microelectronic electrochemical devices and fabrication methods therefor.

BACKGROUND OF THE INVENTION

Recently, there has been a great interest in the field of molecular electronics. The potential for molecular memory devices has been studied where charge storage can be used to read and/or write data. Detailed information with respect to this topic can be found in the following publications: Harell, S. et al., *Microelectron Eng.*, 30, 11 (1996); Reed, M. A. et al., *Since, Volume* 278, 252-254 (1997); Reed, M. A., *Proc. IEEE*, Volume 87, 652-658 (1999); Roth, K. M. et al., *J. Vac. Sci. Technol. B.*, 18(5), 2359 (2000); and Tour, K. M. et al., *J. Am. Chem. Soc.*, 177, 9259 (1999).

A common architecture proposed to incorporate charge molecules is a crossbar array structure. A typical crossbar array includes two sets of lines that run perpendicular to each other. These lines may be separated by a gap that is typically filled with molecules. This arrangement may provide a circuit having a data storage capability.

A typical fabrication process for a crossbar array structure involves depositing and patterning a first set of metal lines. After the first set of lines is deposited and patterned, the molecules may be self-assembled. After the molecules are self-assembled, a second set of metal lines may be deposited and patterned to complete the crossbar array structure. This fabrication process may cause the molecules located in the gap between the first and second set of metal lines to be damaged or destroyed during the deposition and patterning of the second set of metal lines. For example, the molecules in the gap between the first and second metal lines may be destroyed by metal ions diffusing down through the molecules during the deposition of the second set of metal lines.

Alternative methods of fabricating crossbar array structures have been proposed that address the problems with existing fabrication methods. One alternative method, for example, is discussed in co-assigned U.S. patent application Ser. No. 10/046,499 entitled Molehole Embedded 3-D Crossbar Architecture Used in Electrochemical Molecular Memory Device filed on Oct. 26, 2001.

SUMMARY OF THE INVENTION

Embodiments of the present invention provide methods of fabricating microelectronic electrochemical cells. The method includes providing a composite microelectronic structure that includes first and second conductors dielectrically isolated from one another at a crossing thereof. The crossing is surrounded by a dielectric material. A portion of the dielectric material is removed around the crossing of the first and second conductors to form a well that exposes respective outer surfaces of the first and second conductors. A molecule is deposited in the well such that the deposited molecule contacts the exposed outer surfaces of the first and second conductors.

In some embodiments of the present invention, a composite microelectronic structure may be formed by forming the first conductor on a substrate, forming a first dielectric layer on the first conductor, forming the second conductor on the first dielectric layer such that the first and second conductors cross, and forming a second dielectric layer on the substrate. A portion of the dielectric material may be removed by patterning the first and second dielectric layers to form the well. In some embodiments of the present invention, patterning the first and second dielectric layers may include etching the first and second dielectric layers to form the well. Etching may include, for example, wet etching, reactive ion etching (RIE) and chemically assisted ion beam milling (CAIBM).

In further embodiments of the present invention, the exposed outer surface of the first conductor may be used as a counter electrode and the exposed outer surface of the second conductor may be used as a working electrode. In some embodiments, an area of contact between the exposed outer surface of the first conductor and the molecule may be provided that is from about 5 to about 10 times larger than an area of contact between the exposed outer surface of the second conductor and the molecule. In further embodiments, a first area of contact between the exposed outer surface of the first conductor and the molecule may be provided that is from about 1.5 to about 2 times larger than a second area of contact between the exposed outer surface of the second conductor and the molecule.

In still further embodiments of the present invention, at least one of a first area of contact between the exposed outer surface of the first conductor and the molecule and a second area contact of the exposed outer surface of the second conductor may be controllable by varying at least one of a diameter of the well, a thickness of the first conductor and a thickness of the second conductor. The first and second conductors may be disposed on a planar substrate, wherein a centroid of the well is laterally offset with respect to the crossing of the first and second conductors.

In some embodiments of the present invention, the first and second conductors may be metal. The exposed outer surface of the first conductor may include, for example, silver and the exposed outer surface of the second conductor, may include, for example, gold. The molecule may include, for example, an electrolyte.

In further embodiments of the present invention the first and second conductors may be substantially perpendicular relative to one another. The present invention may further include removing a portion of the dielectric material separating the first and second conductors at the crossing to expose opposing faces of the first and second conductors. For example, the second dielectric material may be removed from about 10 Å to about 20 Å on each side of the crossing of the first and second conductors. The etching may be a wet etching, reactive ion etching (RIE) or chemically assisted ion beam milling (CAIBM).

While the present invention is described above primarily with reference to methods of fabricating microelectronic electrochemical cells, corresponding microelectronic electrochemical cells are also provided.

DETAILED DESCRIPTION

The present invention will now be described with reference to the FIGS. 1 through 12, which illustrate various embodiments of the present invention. As illustrated in the Figures, the sizes of layers or regions are exaggerated for illustrative purposes and, thus, are provided to illustrate the general structures of the present invention. Furthermore, various aspects of the present invention are described with reference to a layer being formed on a substrate or other layer. As will be appreciated by those of skill in the art, references to a layer being formed on another layer or substrate contemplates that additional layers may intervene. References to a layer being formed on another layer or substrate without an intervening layer are described herein as being formed "directly" on the layer or substrate. Like numbers refer to like elements throughout.

As described in detail below, microelectronic electrochemical cell structures according to some embodiments of the present invention may be provided having first and second conductors dielectrically isolated from one another at a crossing of the first and second conductors. The crossing may be surrounded by a dielectric material. A portion of this dielectric material may be removed from around the crossing of the first and second conductors to form a well that exposes the outer surfaces of the first and second conductors. A molecule may be deposited in the well such that the deposited molecule contacts the exposed outer surfaces of the first and second conductors. Some embodiments of the present invention may provide methods of forming microelectronic electrochemical structures, for example, molecular memory devices, that may at least partially isolate the molecules from post-processing and, therefore reduce the likelihood of damage to and/or destruction of these molecules as a result of post-processing.

Figure 1:
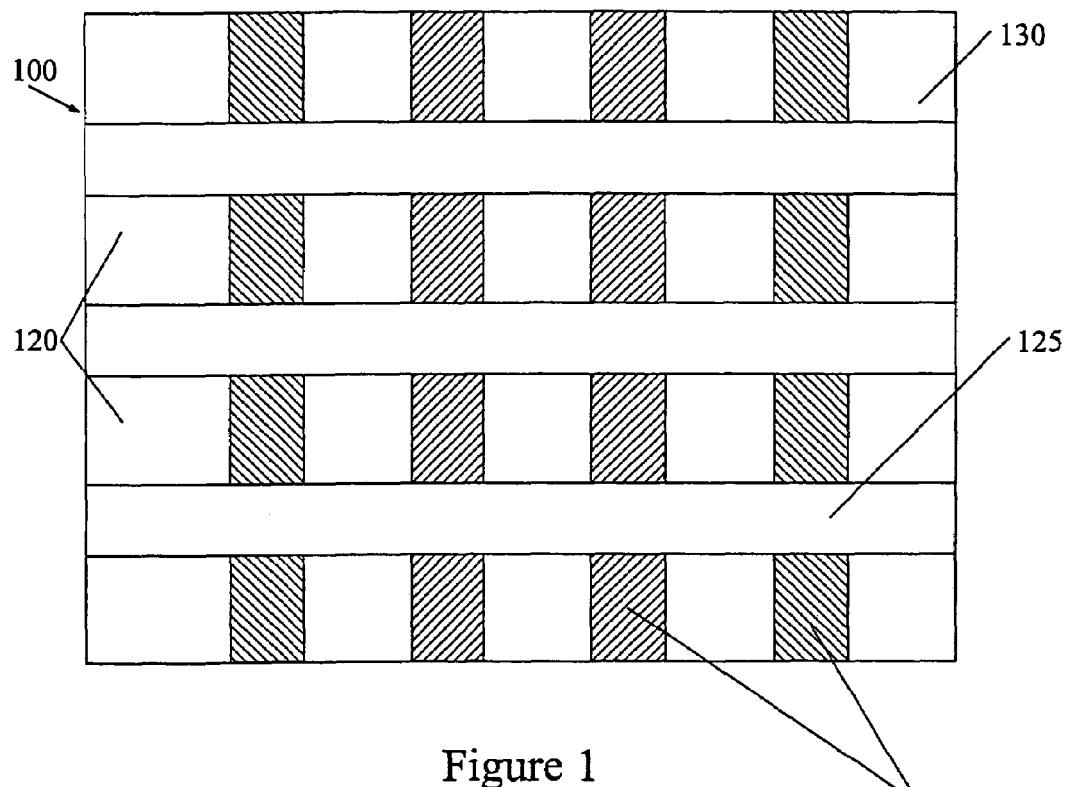
FIG. 1 illustrates crossbar array structures according to some embodiments of the present invention.

Referring to FIG. 1, crossbar array structures including microelectronic cells according to some embodiments of the present invention will now be described below. As seen in FIG. 1, a crossbar array structure 100 consists of a first set of conductive lines 110 and a second set of conductive lines 120 that cross at a crossing 125. These sets of conductive lines may be conducting or semiconducting lines, for example, fabricated metal, organic conductor and/or semiconductor lines. The first set of conductive lines 120 may be separated by a dielectric material 130, for example, silicon dioxide ($SiO_2$). The second set of conductive lines 110 may also be separated by a dielectric material. In other words, the conductive lines are stacked and separated in three dimensions using alternating insulating layers between each of the conductive lines.

It will be understood that although the first and second set of conductive lines are illustrated in FIG. 1 as being perpendicular to one another, the present invention should not be limited to the this configuration. For example, the first and second set of conductive lines may cross at oblique angles.

As discussed briefly above, the first and second conductive lines may be formed of conducting or semiconducting material. For example, the first set of conductive lines 110 may be formed of silver and the second set of conductive lines 120 may be formed of gold. The present invention is not limited to the use of silver and gold, these metals are provided herein for exemplary purposes only. Suitable conductor materials include, but are not limited to copper, silver, tungsten, nickel, palladium, iron, tin, zinc, cadmium, indium, chromium, gold, platinum, aluminum, silicon, germanium, gallium arsenide, ruthenium, titanium, tantalum, carbon nanotube, carbon nanoribbons, a conducting polymer, and the like. Conducting polymers include intrinsically conductive polymers (polymers that conduct electric currents without the addition of conductive (inorganic) substances) and doped conductive polymers. Conductive polymers are well known to those of skill in the art, for example, a commercially available intrinsically conducting polymer is Polyaniline (PAni) (ORMECON™).

Semiconductors can also be used as the "conductors". Suitable semiconductors include, but are not limited to silicon, germanium, n- or p-doped silicon or germanium, various doped carbon nanotubes or nanoribbon, and the like. Other semiconducting materials include, but are not limited to, silicon, dense silicon carbide, boron carbide, $Fe_3O_4$, germanium, silicon germanium, silicon carbide, tungsten carbide, titanium carbide, indium carbide, indium phosphide, gallium nitride, gallium phosphide, aluminum phosphide, aluminum arsenide, mercury cadmium telluride, selenium, ZnS, ZnO, ZnSe, CdS, ZnTe, GaSe, CdSe, CdTe, GaSb, InAs, Te, PbS, InSb, PbTe, PbSe, and tungsten disulfide.

It will be further understood that the present invention is not limited to $SiO_2$ as an insulating material (dielectric material). Insulating materials may include, but are not limited to, high resistivity plastics, insulating oxides or sulfides of the transition metals in the periodic table of elements, ceramics, and glass. Other insulating materials may include chemical vapor deposition insulator materials (for example, silicon nitride) and spin on insulator materials (for example, spin-on glass). In various embodiments of the present invention the insulating material is a dielectric material, which may include, but is not limited to, nafion, cellulose acetate, polystyrene sulfonate, poly(vinylpyridine), electronically conducting polymers such as polypyrrolic acid and polyaniline and the like.

Referring again to FIG. 1, molecules may be formed, for example, self assembled or deposited, at wells 140 surrounding the crossings 125. Molecules may attach to one or more of the conductive surfaces provided by the first and second set of conductive lines. Different molecule types attach to different types of conductors and, thus, the type of molecule used may be dictated by the types of conductors utilized for the sets of conductive lines. The resulting microelectronic electrochemical structure may be operated, for example, as a memory device. For example, an array of such structures (cells) may be used as an integrated memory component in a molecular-based electronic device, a sensor or other device.

Figure 2:
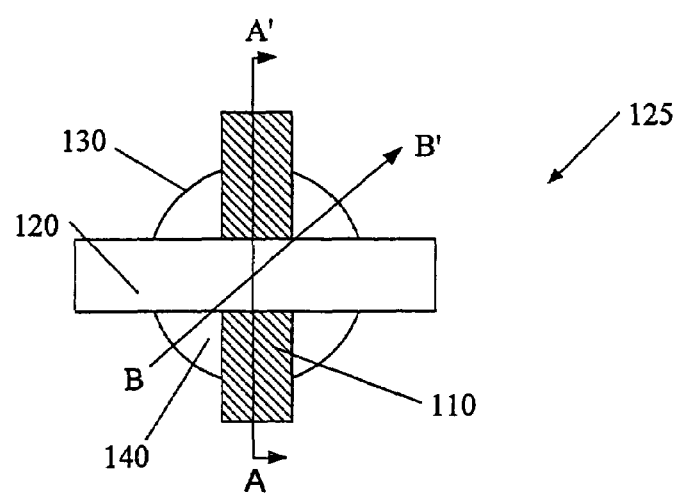
FIG. 2 is magnified view of a crossing of a crossbar array structure according to some embodiments of the present invention.

Now referring to FIG. 2, a magnified view of a crossing 125 according to embodiments of the present invention will be discussed below. As illustrated, first 120 and second 110 crossing conductors are separated by a first intervening dielectric layer (not shown). According to some embodiments of the present invention, a second dielectric layer 130 is formed on the first 110 and second 120 crossing conductors. This second dielectric layer 130 defines a well 140 that exposes the outer surfaces of the first 110 and second 120 conductors.

It will be understood that although the well 140 illustrated in FIG. 1 is circular, the present invention should not be limited to this configuration. Wells according to some embodiments of the present invention, may be any shape. For example, a well 140 may be polygonal, i.e. squares, octagons and the like, or other shapes. It will be further understood that although the centroid of the well illustrated in FIG. 2 is not offset from the center of the crossing 125, the present invention should not be limited to this configuration. For example, the centroid of the well 140 may be laterally offset with respect to the crossing of the first and second conductors. Finally, the size of the well 140 may be as large or small as desired, but may be limited by the distance from one crossing to another.

Figure 3A:
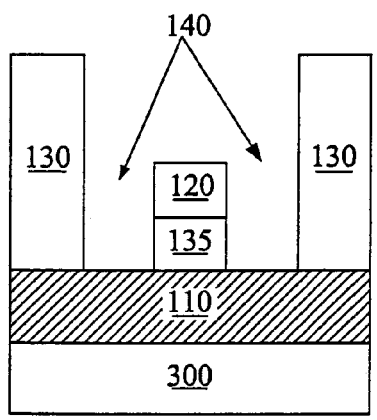
FIG. 3A is a cross-sectional view of an intermediate structure of a crossing of crossbar arrays according to some embodiments of the present invention along the line A-A' of FIG. 2.
Figure 3B:
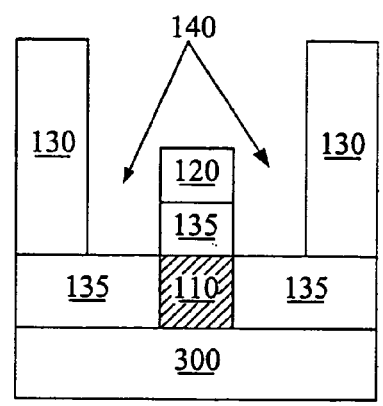
FIG. 3B is a cross-sectional view of an intermediate structure of a crossing of crossbar arrays according to some embodiments of the present invention along the line B-B' of FIG. 2.
Figure 4A:
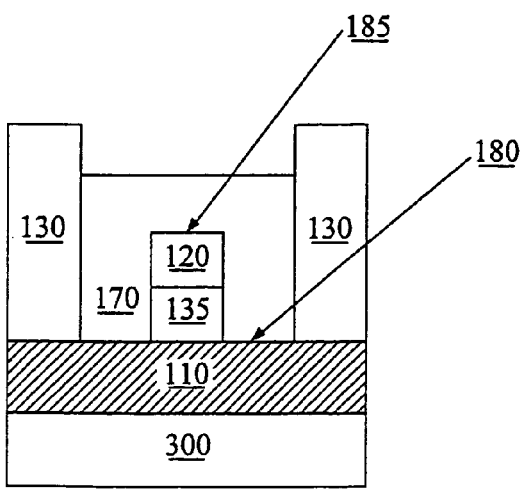
FIG. 4A is a cross-sectional view of a crossing of crossbar arrays according to some embodiments of the present invention along the line A-A' of FIG. 2.
Figure 4B:
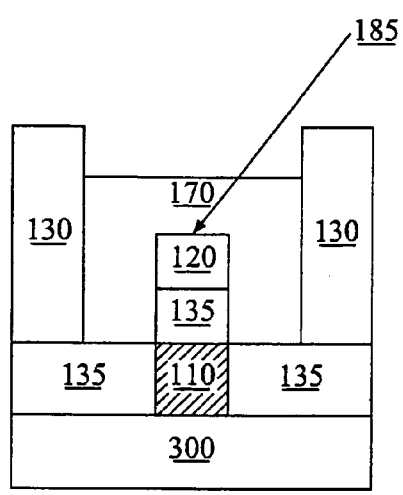
FIG. 4B is a cross-sectional view of a crossing of crossbar arrays according to some embodiments of the present invention along the line B-B' of FIG. 2.

Now referring to FIGS. 3A, 3B, 4A and 4B. FIGS. 3A and 4A illustrate a cross section of the crossing 125 according to some embodiments of the present invention along the line A-A' of FIG. 2. FIGS. 3B and 4B illustrate a cross section of the crossing 125 according to some embodiments of the present invention along the line B-B' of FIG. 2. As illustrated in FIGS. 3A and 3B, a first conductor 110 may be formed on a substrate 300. The substrate 300 may be, for example, glass or thermally grown silicon oxide. A first intervening dielectric layer 135 may be formed on the first conductor 110 and on the substrate 300. A second conductor 120 may be formed on the first intervening dielectric layer 135. Thus, the first and second conductive layers are separated by the first intervening dielectric layer 135. A second dielectric layer 130 may be formed on the first 110 and second 120 crossing conductors. The first intervening dielectric layer 135 and the second dielectric layer 130 may be etched around the crossing to define a well 140 that exposes the outer surfaces of the first 110 and second 120 conductors. As illustrated in FIGS. 4A and 4B, a molecule 170 is formed in the well such that the molecule contacts the exposed outer surfaces of the first and second conductors.

As discussed above, the exposed outer surface of the first conductor 110 may be, for example, silver and the exposed outer surface of the second conductor 120 may be, for example, gold. The molecule 170 may be formed in the well 140 such that the molecule contacts the exposed outer surfaces of the first and second conductors.

The molecule 170 according to some embodiments of the present invention may be, for example, a charge storage or a charge conducting molecule. According to some embodiments of the present invention the molecule 170 may include any of a variety of charge/information molecules or charge/information storage compositions, optionally containing other ingredients such as electrolytes when desired. The charge/information storage medium may be pre-formed and deposited, or may be deposited by forming the charge storage material in situ in the location in which it is deposited. Numerous charge/information storage mediums are known, including but not limited to those described in U.S. Pat. No. 6,208,553 to Gryko et al., U.S. Pat. No. 6,212,093 to Lindsey, U.S. Pat. No. 6,256,767 to Kuckes et al., U.S. Pat. No. 6,272,038 to Clausen et al. and U.S. Pat. No. 6,451,942 to Li et al. and PCT Application No. WO 02/22711 to Thorp et al.

In general, and as described in U.S. Pat. No. 6,208,553, the deposited molecule or storage medium may be electrically coupled to the electrode(s) by any of a number of convenient methods including, but not limited to, covalent linkage (direct or through a linker), ionic linkage, non-ionic "bonding", simple juxtaposition/apposition of the storage medium to the electrode(s), or simple proximity to the electrode(s) such that electron tunneling between the medium and the electrode(s) can occur. The storage medium can contain or be juxtaposed to or layered with one or more dielectric material(s). Preferred dielectric materials are imbedded with counterions, for example, a Nafion.

A wide variety of molecules, for example, as described in U.S. Pat. No. 6,208,553 can be used as molecules and hence comprise the storage medium. Such molecules include, but are not limited to, a porphyrinic macrocycle, a cyclic polyene, a linear polyene, a metallocene, a metal coordination complex, a triple decker sandwich coordination complex, a double decker sandwich coordination complex, a heteroatom-substituted cyclic polyene, a heteroatom-substituted linear polyene, a fullerene, a triarylamine, a 1,4-phenylenediamine, a xanthene, a flavin, a phenazine, a phenothiazine, an acridine, a quinoline, a 2,2'-bipyridine, a 4,4'-bipyridine, a tetrathiotetracene, a peri-bridged naphthalene dichalcogenide a tetrathiafulvalene, a tetraselenafulvalene, a buckyball and a triarylamine. The molecules may further include a porphyrin, an expanded porphyrin, a contracted porphyrin, a phthalocyanine, a triple decker lanthanide sandwich coordination compound, a linear porphyrin polymer, a porphyrin array and a ferrocene. Still further molecules may include a porphyrinic macrocycle substituted at a β-position or at a meso-position. The charge-storage molecules can be attached to one or more linkers bearing surface attachment groups that are well known to those skilled in the art.

The storage medium may comprise a "winged trimer" of porphyrinic macrocycles as described, for example, in U.S. Pat. No. 6,272,038 to Clausen et al. As discussed above, the storage medium may further comprise a sandwich coordination compound, for example, double-decker or triple-decker sandwich coordination compounds, or a polymer of sandwich coordination compounds, as described, for example, in U.S. Pat. No. 6,212,093 to Lindsey or U.S. Pat. No. 6,451,942 to Li et al. The storage medium may still further include a bi-stable molecular switch such as a rotaxane molecule, as described in, for example, U.S. Pat. No. 6,128,214 to Kuekes et al.

The storage medium may further include, for example, as described in, for example, PCT Application WO 02/22711 to Thorp et al., a composition comprising a salt of an organic polymer ion and a polymer (generally polyether or polysiloxane) counter ion. The organic polymer ion may be selected from the group consisting of polypeptides, polynucleic acids, polystyrenes, and polysaccharides (these including copolymers thereof or compounds to which other groups have been joined, such as glycoproteins). The organic polymer ion and the polymer counterion may be redox active, and have the general formula $X^{\pm}Z^{\mp}$, where X is an organic polymer ion and Z is a polymer counterion, subject to the proviso that when X is positively charged then Z is negatively charged, and when X is negatively charged then Z is positively charged. As used herein "charge" may refer to a net positive or negative charge; for example a net positive or negative charge resulting from an absence or excess of electrons, respectively, or a net positive charge (creating a cation) or a net negative charge (creating an anion). In general, the composition may be a melt, preferably at temperatures at which electronic devices such as computers are typically used (e.g., about −50 or −25 to about 100° C.).

In further embodiments, the organic polymer ion may be an anion and the counterion may be a cation. In still further embodiments, the organic polymer ion may be a cation and the counterion may be an anion. In some embodiments either the organic polymer ion is redox active or the polyether counterion is redox active. In further embodiments, both the organic polymer ion and the polyether counterion are redox active. The molar ratio of the organic polymer ion to the polymer counterion (e.g., X and Z in the general formula above) in the composition may be any suitable ratio, such as from about 20:1 or 10:1 to about 1:10 or 1:20. The organic polymer ion may have any suitable molecular weight, such as from about 1, 10 or 100 to 1,000, 10,000, or 100,000 kilodaltons, or more. The polymer counterion may likewise have any suitable molecular weight such as from about 0.2, 0.3, 1, 10 or 100 to 1,000, 10,000, or 100,000 kilodaltons, or more.

In some embodiments of the present invention, the molecule or storage medium is an electrolyte. The electrolyte medium may be prepared by dissolving the electrolyte, for example, 1.0 M or less of one of the following: tetrabutylammonium hexafluorophosphate (TBAH), $LiPF_6$, $LiClO_4$, $LiBF_4$), in a solvent such as propylene carbonate, sulfulane, 3-methyle-2-oxazolidione, 4-methyl-2-pentenone. The viscosity of the medium may be controlled by adding a high molecular weight polymeric material such as poly(vinylidene fluoride)-hexafluoropropylene (PVdF(HFP)), 2-hydroxyethyl methacrylate (HEMA), acrylonitrile, methyl methyacrylate, poly(ethylene oxide) (PEO), polyphosphazenes and the like. In certain embodiments an ionic liquid may replace the solvent/electrolyte medium. Ionic liquids may include 1-ethyl-3-methyl imidazolium tetrafluoroborate, 1-ethyl-3-methyl imidazolium triflate ($CF_3SO_3$), 1-(1-butyl)-3-methylimidazolium hexafluorophosphate, 1-butylpyridinium tetrafluoroborate and the like. The polymer can also be added to the ionic liquid to control its viscosity. Aqueous electrolyte such as KCL in $H_2O$ can also be used with compatible molecules. For example, solid electrolytes, gel electrolytes and conductive polymers may be used in this approach.

Referring again to FIGS. 3A, 3B, 4A and 4B, the exposed outer surfaces of the first and second conductors may act as electrodes. As used herein, an electrode is a medium capable of transporting a charge (e.g., electrons), such as a metal or a conductive organic material. As shown in FIGS. 4A and 4B, the exposed outer surface of the first conductor 110 may act as a counter electrode (where voltage is applied) and the exposed outer surface of the second conductor 120 may act as a working electrode (where molecules attach). An area of contact between the exposed outer surface of the first conductor 110 and the molecule 170 may be from about 5 to about 10 times larger than an area of contact between the exposed outer surface of the second conductor 120 and the molecule 170. Alternatively, in other embodiments of the present invention the first area of contact between the exposed outer surface of the first conductor 110 and the molecule may be from about 1.5 to about 2 times larger than a second area of contact between the exposed outer surface of the second conductor 120 and the molecule 170.

The dimensions of the structure shown in FIGS. 4A and 4B may be varied to alter the characteristics of the device. For example, an electrode area may be determined by the diameter of the well 140 and the thickness of the first and second conductors 110, 120. For example, the first area of contact 180 between the exposed outer surface of the first conductor 110 and the molecule 170 may be controllable by varying at least one of a diameter of the well 140, a thickness of the first conductor 110, a thickness of the second conductor 120 and/or a thickness of the lines themselves. Similarly, the second area of contact 185 between the exposed outer surface of the second conductor 120 and the molecule may also be controllable by varying at least one of a diameter of the well 140, a thickness of the first conductor 110, a thickness of the second conductor 120 and/or a thickness of the lines themselves. In particular, if the diameter of the well 140 is 1 μm and the thickness of the conductors are 100 nm, the electrode area would be about 310 $nm^2$.

Figure 5A:
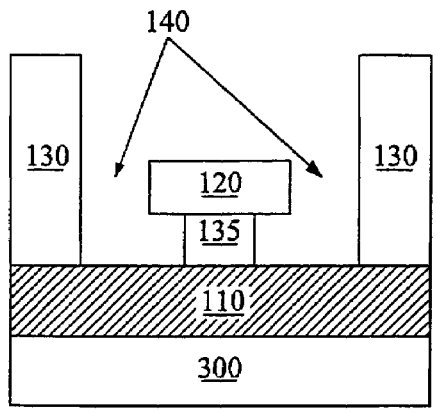
FIG. 5A is a cross-sectional view of a crossing of crossbar arrays according to some embodiments of the present invention along the line A-A' of FIG. 2.
Figure 5B:
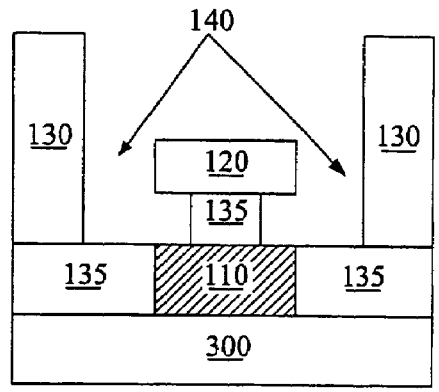
FIG. 5B is a cross-sectional view of a crossing of crossbar arrays according to some embodiments of the present invention along the line B-B' of FIG. 2.

It will be understood that the present invention should not be limited to embodiments of the present invention illustrated in FIGS. 4A and 4B. Further embodiments of the present invention are illustrated in FIGS. 5A and 5B. FIG. 5A illustrates a cross section of the crossing 125 according to some embodiments of the present invention along the line A-A' of FIG. 2. FIG. 5B illustrates a cross section of the crossing 125 according to some embodiments of the present invention along the line B-B' of FIG. 2. As illustrated in FIGS. 5A and 5B, a first conductor 110 may be formed on a substrate 300. The substrate 300 may be, for example, glass or thermally grown silicon oxide. A first intervening dielectric layer 135 may be formed on the first conductor 110 and on the substrate 300. A second conductor 120 may be formed on the first intervening dielectric layer 135, such that the first and second conductive layers are separated by the first intervening dielectric layer 135.

A second dielectric layer 130 may be formed on the first 110 and second 120 crossing conductors. The first intervening dielectric layer 135 and the second dielectric layer 130 may be etched around the crossing to define a well 140 that exposes outer surfaces of the first 110 and second 120 conductors. The first intervening dielectric layer 135 may be further etched as illustrated in FIGS. 5A and 5B to expose opposing faces of the first and second conductors 110, 120, i.e. such that first and second widths of the first and second conductors 110, 120 are larger than a width of the first intervening dielectric layer 135. For example, the first intervening dielectric layer 135 may be etched from about 10 Å to about 20 Å on each side of the crossing of the first and second conductors 110, 120 such that the width of the first intervening dielectric layer 135 is decreased by about 20 Å to about 40 Å.

Figure 6:
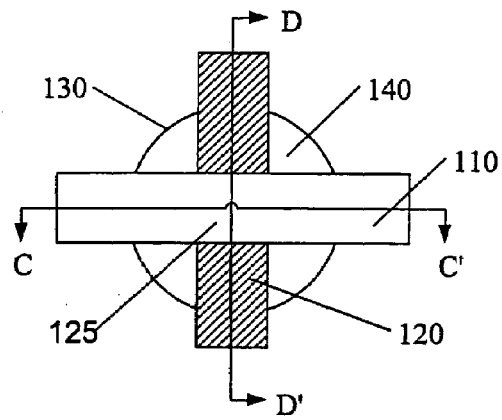
FIG. 6 is magnified view of a crossing of crossbar arrays according to some embodiments of the present invention.
Figure 9A:
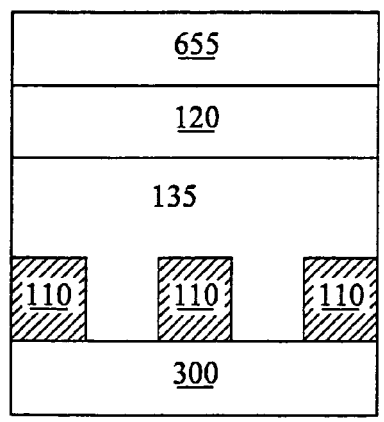
Figure 9B:
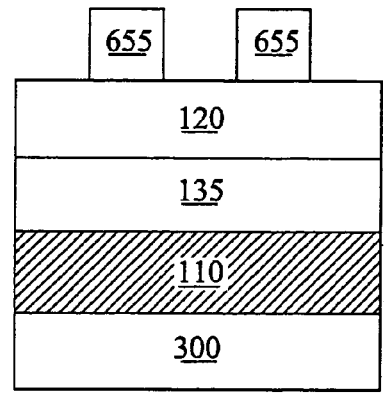
Figure 10A:
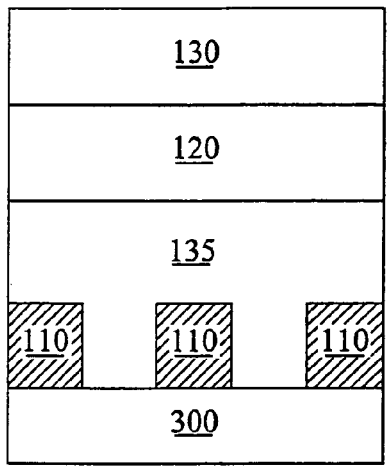
Figure 10B:
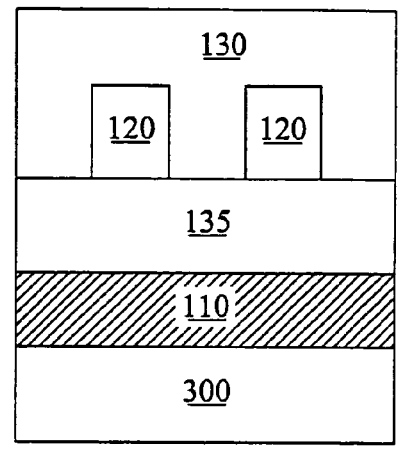
Figure 11:
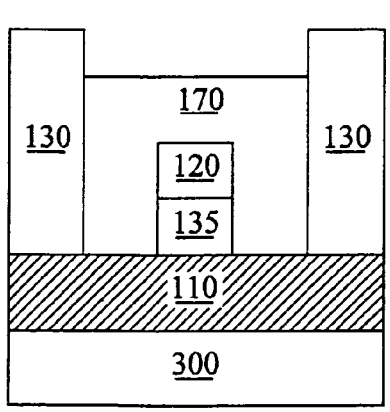
Figure 12:
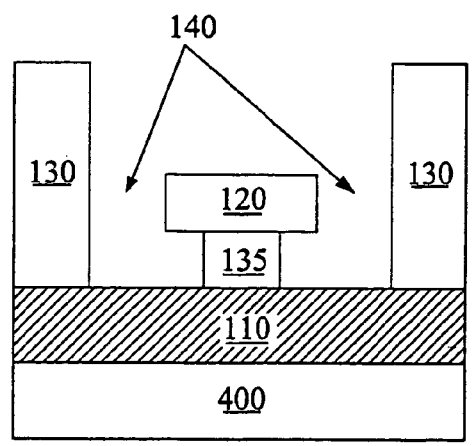

FIGS. 6 through 12 illustrate fabrication of microelectronic structures according to some embodiments of the present invention. In particular, FIG. 6 illustrates a magnified view of a crossing according to some embodiments of the present invention. FIGS. 7A through 10A illustrate a cross section of the crossing 125 along the line C-C' of FIG. 6. FIGS. 7B through 10B illustrate a cross section of the crossing 125 along the line D-D' of FIG. 6. FIGS. 11 and 12 illustrate cross sections along the line A-A' of FIG. 2, which depict alternate resulting structures of the processes described with respect to FIGS. 7 through 10 below.

Figure 7A:
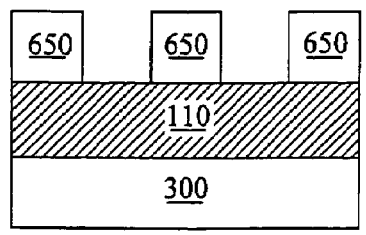
FIGS. 7A through 12 illustrate processing steps in the fabrication of microelectronic electrochemical cell according to some embodiments of the present invention.
Figure 7B:
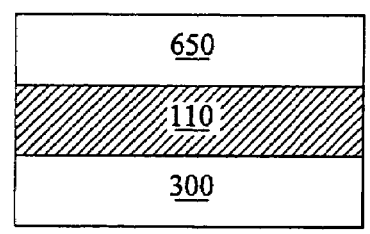

As seen in FIGS. 7A and 7B, a first conductive layer 110, for example, silver (Ag), is deposited on the substrate 300, which may be a solid material suitable for attachment of one or more molecules, such as, glass, thermally grown silicon oxide, silicon, germanium, minerals, doped silicon, doped germanium, ceramics, metals and the like. A resist 650 may be formed to pattern the first conductive layer 110 into lines (wires) as illustrated, for example, in FIG. 1. In particular, a UV-sensitive layer, for example, a photoresist layer may be applied to the first conductive layer 110. A mask including, for example, quartz glass with patterned chrome, may be placed on the first conductive layer 110 that has been coated with a UV-sensitive layer. The chrome-pattern of the quartz glass may block UV light in the areas covered by the chrome-pattern. The structure may be placed into a developer solution and the photoresist in the areas exposed to the UV light, i.e., the areas not covered by the chrome-pattern, may be removed. Thus, a resist 650 may remain on the portions of the first conductive layer 110 covered by the chrome-pattern. The first conductive layer 110 may be etched and the portions of the first conductive layer 110 covered by the resist 650 may be blocked from the etchant. The resist 650 may then be removed by, for example, using a stripping solution.

Alternatively, a hard mask 650 may be formed to pattern the first conductive layer 110 into lines (wires) as illustrated, for example, in FIG. 1. For example, a thin layer of hard mask material, for example, nitride or polysilicon may be formed on the first conductive layer 110. A UV-sensitive layer, for example, a photoresist may formed on the hard mask material. A mask including, for example, quartz glass with patterned chrome, may be placed on the first conductive layer 110 that has been coated with a hard mask material and a UV-sensitive layer. The chrome-pattern of the quartz glass may block UV light in the areas covered by the chrome-pattern. The structure may be placed into a developer solution and the photoresist in areas exposed to the UV light, i.e., the areas not covered by the chrome-pattern, may be removed. The portions of the hard mask material exposed by the removal of the photoresist may be removed. The remaining photoresist may be removed by, for example, using a stripping solution. Furthermore, a hard mask 650 may remain on the portions of the first conductive layer covered by the chrome-pattern. The first conductive layer 110 may be etched and the portions of the first conductive layer 110 covered by the hard mask 650 may be blocked from the etchant. The hard mask 650 may be removed form the first conductive layer. A hard mask may provide increased etch selectively relative to the resist discussed above.

Figure 8A:
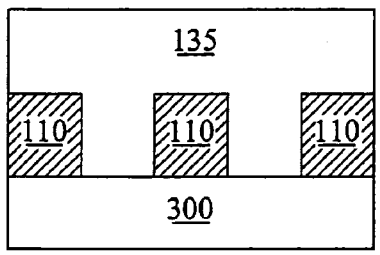
Figure 8B:
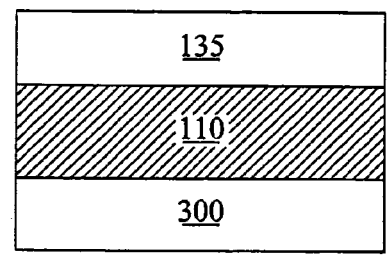

As seen in FIGS. 8A and 8B, a first intervening dielectric layer 135 is deposited (e.g. by chemical vapor deposition (CVD)) on the patterned first conductive layer 110 and on portions of the substrate 300 where the first conductive layer 110 has been removed. As seen in FIGS. 9A and 9B, a second conductive layer 120 may be formed on the first intervening dielectric layer 135. A resist or hard mask 655 may be used to pattern the second conductive layer 120 into lines as discussed above with respect to FIGS. 7A and 7B.

As illustrated in FIGS. 10A and 10B, a second dielectric layer 130 may be formed on the first 110 and second 120 conductive layers, such that the second dielectric layer 130 are disposed between the portions of the second conductive layer 120 that were not removed and the crossing (125 of FIG. 2) of the first and second conductive layers is surrounded by the second dielectric material 130. It will be understood that "surrounded" as used herein does not necessarily mean completely surrounded, and can encompass embodiments wherein the crossing is only partially surrounded by the dielectric material.

Referring now to FIG. 11, the first intervening dielectric layer 135 and the second dielectric layer 130 may be etched or otherwise removed around the crossing of the first and second conductive layers to define a well 140 that exposes the outer surfaces of the first 110 and second 120 conductive layers. It will be understood that this etch is around the crossing of the first and second conductive layers as illustrated in FIG. 6 and may or may not include etching of portions of the first and second conductive layers. Etching according to some embodiments of the present invention may include wet etching, reactive ion etching (RIE) and/or chemically assisted ion beam milling (CAIBM). A molecule 170 may be deposited in the well 140.

As discussed above, the present invention is not limited to embodiments of the present invention illustrated in FIG. 11. For example, referring to FIG. 12, the first intervening dielectric layer 135 and the second dielectric layer 130 may be etched to define a well 140 that exposes opposing faces of the first and second conductors 110, 120. Thus, first and second widths of the first and second conductors may be larger than a width of the first intervening dielectric layer 135 such that opposing faces of the first and second conductors are exposed. For example, the first intervening dielectric layer may be etched from about 10 Å to about 20 Å on each side of the crossing of the first and second conductors such that the width of the first intervening dielectric layer 135 is decreased by about 20 Å to about 40 Å.

As discussed above, a plurality of the cells depicted in FIGS. 10 and 11 may be combined into an array that may be used in a memory device, assay or the like. Each well may include the same species of molecules or respective wells may include different species of molecule. Arrays including microelectronic electrochemical cells according to some embodiments of the present invention may be used, for example, as nanoelectrodes to measure rates of electron transfer of electroactive molecular monolayers or as molecular switches by suspending a single bound electroactive molecule in a single well. The multi-integrated molecular well can also be used in bioanalytical applications, for example, derivitazation and sensing of proteins and DNA, and single cell analysis using electrochemical detection or fluorescence. Such electrochemical cell arrays may be suitable for high throughput analysis schemes using numerous electroactive analytes or non-electroactive analytes through indirect detection schemes. The present invention may also be useful in combination with existing on chip microfluidic systems.

As is briefly described above, microelectronic electrochemical structures according to some embodiments of the present invention provide a well around a crossing of first and second conductors. The molecules may be injected into the crossing after the first and second conductors, thus, reducing the exposure of the molecules to post-processing of the conductive layers. This may provide an advantage over conventional crossbar array structures that subject the molecules to post-processing and therefore sacrifice the integrity of the molecules in the structure. Furthermore, the effective capacitance at each crossing may be diminished by the removal of the dielectric material surrounding the well. This may have an overall effect on the overall conductor line capacitance, but it may not impact the resistance of the conductor lines significantly if the conductive layers are thick enough.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A microelectronic electrochemical cell, comprising: first and second crossing conductors that cross at a crossing and are separated by a first intervening dielectric layer on a substrate; and
a second dielectric layer on the substrate that defines a well around the crossing that exposes respective outer surfaces of the first and second conductors.

2. A cell according to claim 1, further comprising a molecule in the well such that the molecule contacts the exposed outer surfaces of the first and second conductors.

3. A cell according to claim 2, wherein the exposed outer surface of the first conductor acts as a counter electrode and the exposed outer surface of the second conductor acts as a working electrode.

4. A cell according to claim 3, wherein an area of contact between the exposed outer surface of the first conductor and the molecule is from about 5 to about 10 times larger than an area of contact between the exposed outer surface of the second conductor and the molecule.

5. A cell according to claim 3, further comprising providing a first area of contact between the exposed outer surface of the first conductor and the molecule that is from about 1.5 to about 2 times larger than a second area of contact between the exposed outer surface of the second conductor and the molecule.

6. A cell according to claim 2, wherein at least one of a first area of contact between the exposed outer surface of the first conductor and the molecule and a second area contact of the exposed outer surface of the second conductor is/are controllable by varying at least one of a diameter of the well, a thickness of the first conductor and a thickness of the second conductor.

7. A cell according to claim 2:
wherein the exposed outer surface of the first conductor comprises silver;
wherein the exposed outer surface of the second conductor comprises gold; and
wherein the molecule comprises an electrolyte.

8. A cell according to claim 1, wherein respective first and second widths of the first and second conductors are larger than a width of the intervening dielectric layer such that opposing faces of the first and second conductors are exposed.

9. A cell according to claim 8, wherein the opposing faces of the first and second conductors are exposed from about 10 Å to about 20 Å on each side of the crossing of the first and second conductors.

10. A cell according to claim 1, wherein the first and second conductors are disposed on a planar substrate, and wherein a centroid of the well is laterally offset with respect to the crossing of the first and second conductors.

11. A cell according to claim 1, wherein at least one of the first and second conductors comprises a metal.

12. A cell according to claim 1, wherein the exposed outer surface of the first conductor comprises silver and the exposed outer surface of the second conductor comprises gold.

13. A cell according to claim 1, wherein the first and second conductors are substantially perpendicular relative to one another.

14. A microelectronic electrochemical cell, comprising:
a first conductor on a substrate;
a first dielectric layer on the first conductor;
a second conductor on the first dielectric layer such that the first and second conductors cross at a crossing; and
a second dielectric layer on the substrate that defines a well around the crossing that exposes respective outer surfaces of the first and second conductors.

15. A cell according to claim 14, further comprising a molecule in the well such that the molecule contacts the exposed outer surfaces of the first and second conductors.

16. A cell according to claim 15, wherein the exposed outer surface of the first conductor acts as a counter electrode and the exposed outer surface of the second conductor acts as a working electrode.

17. A cell according to claim 16, wherein an area of contact between the exposed outer surface of the first conductor and the molecule is from about 5 to about 10 times larger than an area of contact between the exposed outer surface of the second conductor and the molecule.

18. A cell according to claim 16, further comprising providing a first area of contact between the exposed outer surface of the first conductor and the molecule that is from about 1.5 to about 2 times larger than a second area of contact between the exposed outer surface of the second conductor and the molecule.

19. A cell according to claim 15, wherein at least one of a first area of contact between the exposed outer surface of the first conductor and the molecule and a second area contact of the exposed outer surface of the second conductor is/are controllable by varying at least one of a diameter of the well, a thickness of the first conductor and a thickness of the second conductor.

20. A cell according to claim 15:
wherein the exposed outer surface of the first conductor comprises silver;
wherein the exposed outer surface of the second conductor comprises gold; and
wherein the molecule comprises an electrolyte.

21. A cell according to claim 15, wherein respective first and second widths of the first and second conductors are larger than a width of the intervening dielectric layer such that opposing faces of the first and second conductors are exposed.

22. A cell according to claim 21, wherein the opposing faces of the first and second conductors are exposed from about 10 Å to about 20 Å on each side of the crossing of the first and second conductors.

23. A cell according to claim 14, wherein the first and second conductors are disposed on a planar substrate, and wherein a centroid of the well is laterally offset with respect to the crossing of the first and second conductors.

24. A cell according to claim 14, wherein at least one of the first and second conductors comprises a metal.

25. A cell according to claim 14, wherein the exposed outer surface of the first conductor comprises silver and the exposed outer surface of the second conductor comprises gold.

26. A cell according to claim 14, wherein the first and second conductors are substantially perpendicular relative to one another.

27. A memory cell, comprising:
   first and second crossing conductors that cross at a crossing and are separated by an first intervening dielectric layer on a substrate; and
   a second dielectric layer on the substrate that defines a well around the crossing that exposes respective outer surfaces of the first and second conductors.

28. A cell according to claim 27, further comprising a molecule in the well such that the molecule contacts the exposed outer surfaces of the first and second conductors.

29. A cell according to claim 27, wherein respective first and second widths of the first and second conductors are larger than a width of the intervening dielectric layer such that opposing faces of the first and second conductors are exposed.

30. An assay, comprising:
   first and second crossing conductors that cross at a crossing and are separated by an first intervening dielectric layer on a substrate; and
   a second dielectric layer on the substrate that defines a well around the crossing that exposes respective outer surfaces of the first and second conductors.

31. A cell according to claim 30, further comprising a molecule in the well such that the molecule contacts the exposed outer surfaces of the first and second conductors.

32. A cell according to claim 31, wherein respective first and second widths of the first and second conductors are larger than a width of the intervening dielectric layer such that opposing faces of the first and second conductors are exposed.

* * * * *